(12) United States Patent
Gohda et al.

(10) Patent No.: US 6,598,255 B1
(45) Date of Patent: Jul. 29, 2003

(54) CLEANING ROTARY BRUSH

(75) Inventors: Shuki Gohda, Sashima-gun (JP);
Masao Ide, Sashima-gun (JP); Konomu Tokunaga, Sashima-gun (JP)

(73) Assignee: Aion Co., Ltd., Osaka (JP)

( * ) Notice: Subject to any disclaimer, the term of this patent is extended or adjusted under 35 U.S.C. 154(b) by 0 days.

(21) Appl. No.: 09/701,111

(22) PCT Filed: May 24, 1999

(86) PCT No.: PCT/JP99/02725

§ 371 (c)(1),
(2), (4) Date: Jan. 16, 2001

(87) PCT Pub. No.: WO99/60888

PCT Pub. Date: Dec. 2, 1999

(30) Foreign Application Priority Data

May 22, 1998 (JP) .......................................... 10-141668

(51) Int. Cl.⁷ .............................................. B08B 11/00
(52) U.S. Cl. ...................................... 15/102; 15/230.16
(58) Field of Search .................... 15/21.1, 102, 230.16, 15/97.1

(56) References Cited

U.S. PATENT DOCUMENTS 5,311,634 A * 5/1994 Andros
5,778,481 A * 7/1998 Amsden
6,006,391 A * 12/1999 Shurtliff

OTHER PUBLICATIONS

Japanese Utility Model Application Laid–Open No. 61-158948; Laying Open date: Oct. 2, 1986.
Japanese Utility Model Application Laid Open No. 63-152694; Laying Open date: Oct. 6, 2988.
Japanese Patent Application Laid Open No. 10-34091; Laying Open date: Feb. 10, 1998.
Japanese Patent Application Laid Open No. 9-171983; Laying Open Date: Jun. 30, 1997.
Japanese Patent Application Laid Open No. 9-510388; Laying Open date: Oct. 21, 1997.

* cited by examiner

*Primary Examiner*—Randall E. Chin
(74) *Attorney, Agent, or Firm*—Pitney, Hardin, Kipp & Szuch LLP

(57) ABSTRACT

A cleaning rotary brush 1 comprises a hard base 3 mounted to a rotary shaft and a plurality of ridged projections 27 formed on and projecting from the working surface of the base 3, the tops of said ridged projections 27 in contact with an object to be cleaned while rotating in substantially the same plane. The ridged projections 27 are made of a polyvinyl acetal porous elastomer and disposed continually on a plurality of phantom setting lines 31 extending from inner reference, points 31a on the side of the center of rotation 35 of the working surface to outer reference points 31b on the side of the outer periphery 17b of the working surface. The length L1 in a longitudinal direction of said ridged projections 27 is made longer than the length D1 in a widthwise direction of the ridged projections 27. Thus, the spent cleaning liquid containing dirt or particles scrubbed from the portion to be cleaned is guided by the ridged projections 27, led adequately to outer reference points 31b, and rapidly drained off to the outside of the system.

6 Claims, 5 Drawing Sheets

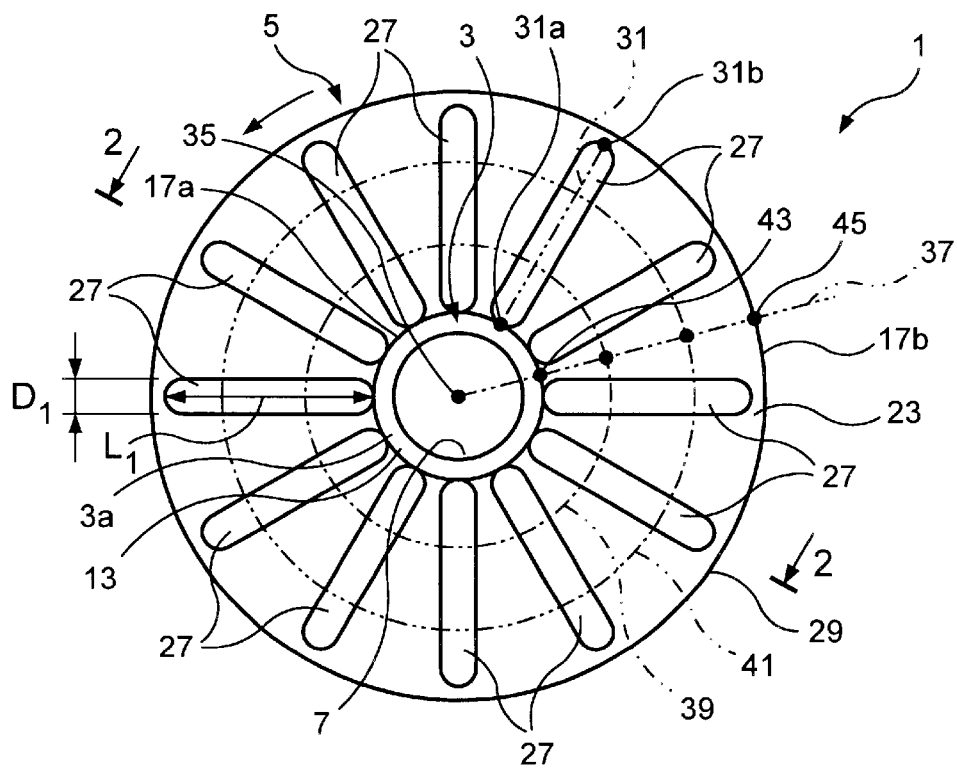
F I G. 1
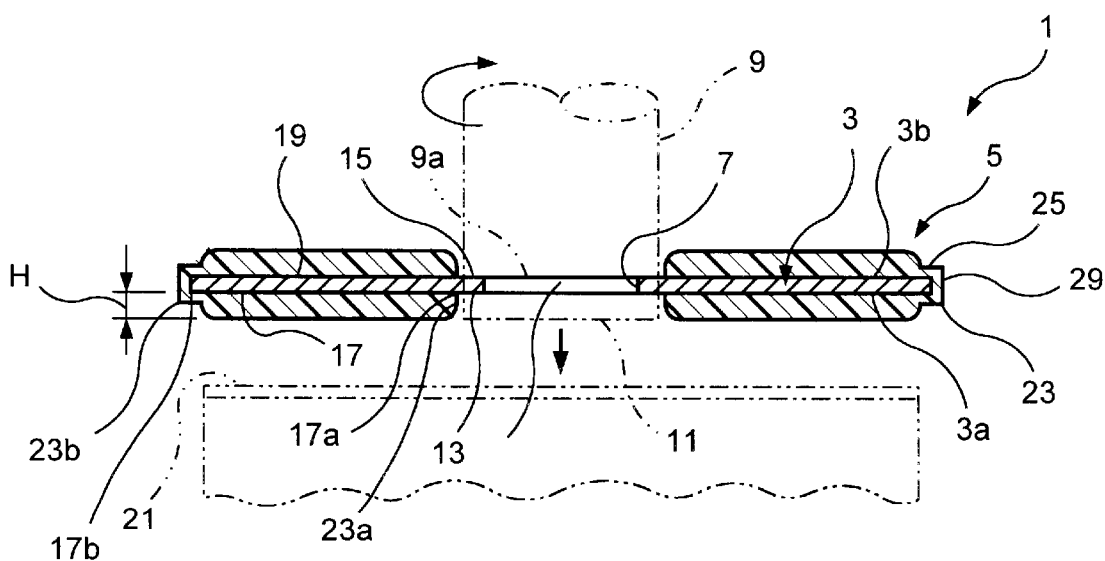
F I G. 2

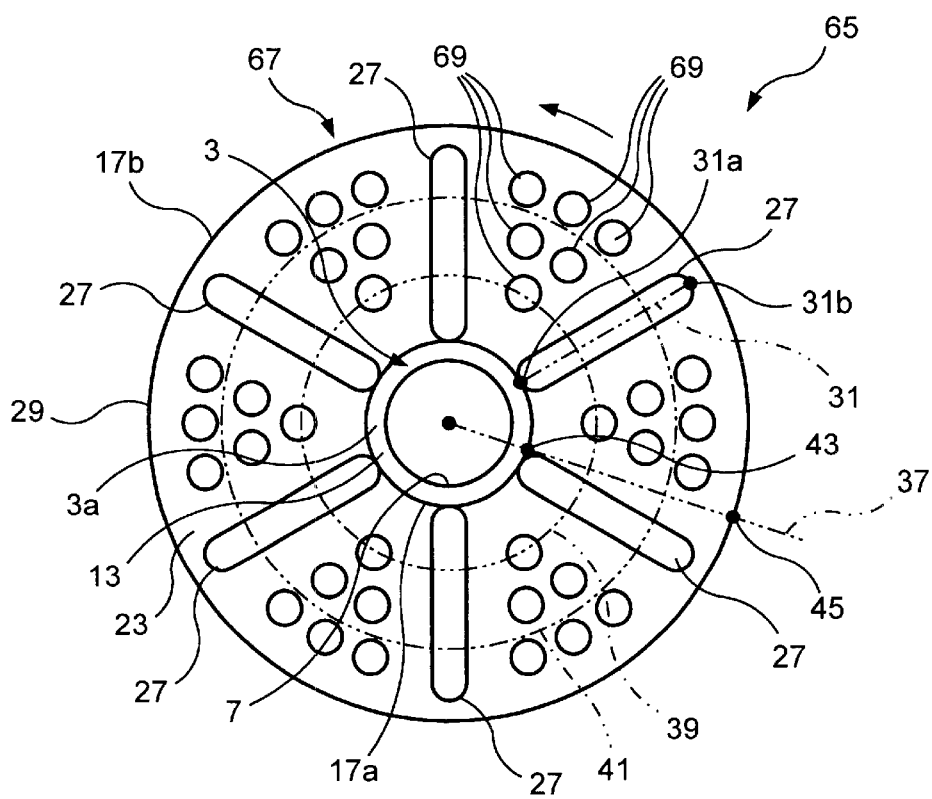
F I G. 5
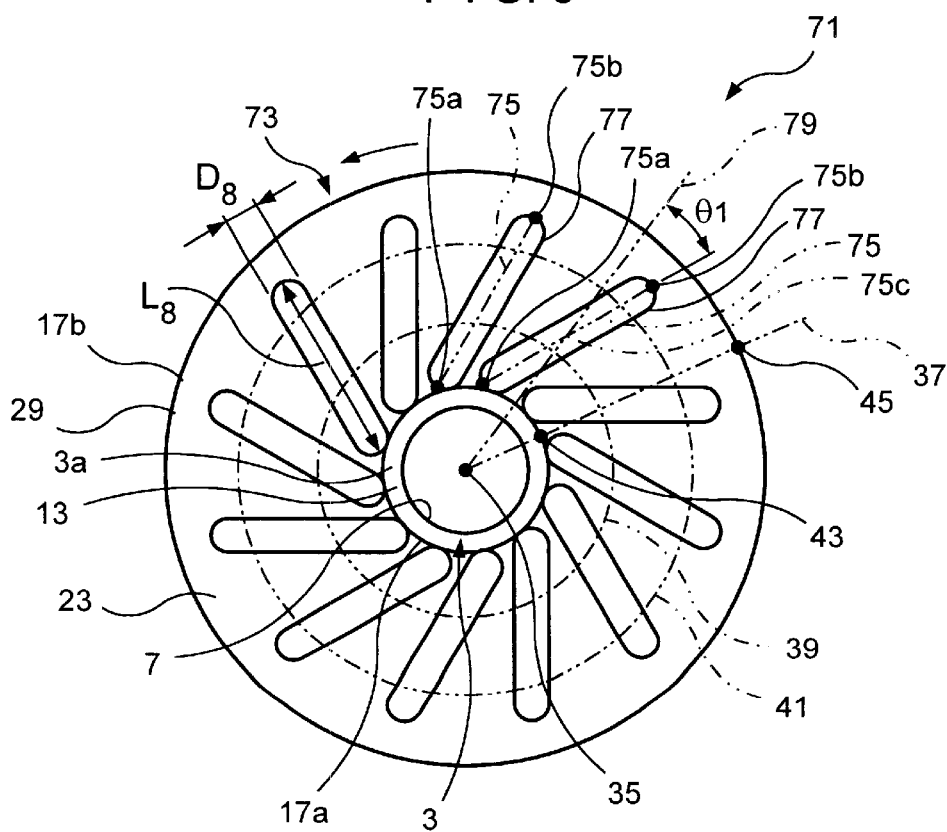
F I G. 6

CLEANING ROTARY BRUSH

FIELD OF TECHONOGY

The present invention relates to a rotary brush suitable for a minute cleaning in a process of the production of articles, for which extremely high surface accuracy and cleanness are required, for example, electronics components, such as silicon wafer, photo masks, magnetic disk substrates, glass substrates for liquid crystal, in particular, to a rotary brush suitable for a brush scrubbing cleaning.

BACKGROUND OF TECHNOLOGY

There has been remarkably improved in the accuracy of various articles in electronics industry during recent years, as represented, for example, by the degree of integrity of a silicon wafer or the recording density on a magnetic disk, and Accordingly there have been great demands for the finishing accuracy of the surface of components and cleanness. Especially, chemical contamination or adhered particles on the surface of components could have a great effect on the yield or the reliability of the operation of the products, and therefore the significance of the minute cleaning in a process of production is great.

The wet brush scrubbing method was known as the conventional method for the minute cleaning. In the brush scrubbing method, a rotating brush is forced against an object to be cleaned while scrub-cleaning it with water or other cleaning liquid being supplied, and the method is widely used, since the construction of the apparatus is simple and the cleaning cost is low, and it shows an excellent cleaning power.

There are two types of shape of the brush, a roller type and cup type, used for the brush scrubbing cleaning. The roller type brush makes a line contact whereas the cup type brush makes a plane contact. The cup type brush therefore has advantages of a broader contact area and less cleaning spots as compared with the roller type.

The cup type brush as commonly used has a brush body of a circular disk on which a plurality of synthetic fiber monofilaments is planted or nonwoven fabrics are bonded.

However, the cup brush which employs synthetic fiber monofilaments or nonwoven fabrics would possibly cause other troubles that there were scratches on the surface of an object to be cleaned due to the stiffness of the fiber and the contamination by the fiber coming off, or the like.

With regard to the troubles, there was made a proposal of a cleaning rotary brush using cylindrical projections of a polyvinyl acetal (hereinafter referred to as PVAt) elastomer as a contact portion with an object to be cleaned (Japanese Utility Model Publication No. SHO-64-6953). The PVAt elastomer has excellent water-holding and abrasion resistance properties and shows proper flexibility when water contained Thus, the cleaning rotary brush using PVAt elastomer is suitable for a minute cleaning of electronics components, since it hardly makes scratches on an object to be cleaned and has excellent durability.

In the cup brush, the dirt or particles scrubbed from the surface of an object to be cleaned move together with the spent cleaning liquid over the surface of an object to be cleaned to the outer periphery thereof, and are ultimately drained off to the outside the system.

Although the conventional rotary brush using PVAt porous elastomer described above was constructed taking into consideration the flow of the spent cleaning liquid over the surface of an object to be cleaned, it could not fully meet the increased requirements of the latest minute cleaning. In other words, the spent cleaning liquid containing dirt or particles reside unnecessarily on the surface of an object to be cleaned, and there could be a possibility of the recontamination on the surface of an object to be cleaned of the dirt or particles residing for a longer time, and therefore, it was demanded that the dirt, and the like scrubbed from the surface of an object to be cleaned should be quickly drained off to the outside of the system and the occurrence of such recontamination should be reduced further.

Moreover, in case of the residing particles being hard materials such as grit, when the residing particles are forced against the surface of an object to be cleaned, there could be scratches made by the particles on the surface of the object to be cleaned. Since the PVAt porous elastomer in contact with the surface of the object to be cleaned is flexible in the conventional rotary brush as described above, such undesirable matter could be overcome to some extent, and however, the latest increased requirements of the minute cleaning could not be met satisfactorily, and in this respect, it was desired that the residing particles, and the like could be quickly drained off to the outside of the system. In view of the circumstances discussed above, the present invention has been made, and the object is to provide a cleaning rotary brush which can drain off the particles scrubbed from an object to be cleaned quickly to the outside of the system and has an excellent cleaning efficiency.

DESCLOUSUR OF INVENTION

In order to achieve the objects mentioned above, in the first embodiment of the present invention, a cleaning rotary brush is provided with a hard base, when mounted to a rotary shaft, having a rotating working surface opposite a portion to be cleaned, and a plurality of cleaning members disposed on and projecting from the working surface, the tops of said cleaning members being in contact with said portion to be cleaned while rotating in substantially the same plane, characterized in that said cleaning members made of a polyvinyl acetal porous elastomer and comprising a plurality of ridged projections positioned continually on a plurality of phantom setting lines extending from inner reference points on the side of the center of rotation of the working surface to outer reference points on the side of the outer periphery of the working surface, and the length in a longitudinal direction of said ridged projections along said phantom setting lines being made longer than the length in a widthwise direction of the ridged projections.

In the first embodiment, the inner reference point may be disposed further inside the inner circle of the two concentric circles which trisect the distance between the intersections of a line passing through the center of rotation with the innermost and outermost edges of the sheet, and the outer reference point may be disposed further outside the outer circle of the two circles.

Incidentally, the inner reference point may be disposed adjacent to the innermost edge of the sheet, and the outer reference point may be disposed adjacent to the outermost edge of the sheet.

In the second embodiment of the present invention, a cleaning rotary brush is provided with a sheet member mounted on and rotating in unity with a rotating working surface opposite a portion to be cleaned and cleaning members disposed on and projecting from the sheet member, the tops of said cleaning members rotating in substantially the same plane while being in contact with the portion to be cleaned, characterized in that said cleaning members being made of a polyvinyl acetal porous elastomer and comprising a plurality of ridged projections positioned continually on a plurality of phantom setting lines extending from inner reference points on the side of the center of rotation of the sheet member to outer reference points on the side of the outer periphery of the sheet member, and the length in a longitudinal direction of said ridged projections along said phantom setting lines being formed longer than the length in a widthwise direction of the ridged projections.

In the second embodiment, the inner reference point may be disposed further inside the inner circle of the two concentric circles which trisect the distance between the intersections of a line passing through the center of rotation with the innermost and outermost edges of the sheet member, and the outer reference point may be disposed further outside the outer circle of the two circles.

Furthermore, the inner reference point may be disposed adjacent to the innermost edge of the sheet member, and the outer reference point may be disposed adjacent to the outermost edge of the sheet member.

Incidentally, the sheet member and ridged projections may also be made in unity of a polyvinyl acetal porous elastomer.

Besides, in the first or second embodiment, the ridged projections may be formed integrally and continually for each of the phantom setting lines.

Incidentally, the length in a longitudinal direction of the ridged projections may be formed more than or equal to twice the length in a widthwise direction.

Furthermore, the length in a widthwise direction of the ridged projections may be formed varying with the position on the phantom setting line.

The third embodiment of the present invention is characterized in that the phantom setting lines are generally a straight line in the cleaning rotary brush of the first or second embodiment.

The fourth embodiment of the present invention is characterized in that the phantom setting lines are at a slant to a line passing through the center of rotation in the cleaning rotary brush of the third embodiment.

In the fourth embodiment, the crossing angle between the phantom setting line and the line passing through the center of rotation and a midpoint that bisects the distance between the inner and outer reference points of the phantom setting line may be limited to a range of 0° to 4°.

Besides, the phantom setting lines may be all set at a slant backward in a direction of the rotation of the base or sheet member.

In the fifth embodiment of the present invention, the cleaning rotary brush of the first or second embodiment is characterized in that the phantom setting lines are curvilinear.

In the sixth embodiment of the present invention, the cleaning rotary brush of the embodiment is characterized in that the phantom setting lines are a curve protruding in one direction, and a tangent to the phantom setting line at a midpoint which bisects the length along the phantom setting line between the inner and outer reference points is at a slant with respect to a line passing through the center of rotation and midpoint.

In the sixth embodiment, the crossing angle between the tangent and the line passing through the midpoint and center of rotation may be limited to a range of more than 0° to 45°.

Incidentally, the tangents to the respective curved lines at the midpoints may be all set at a slant backwards in a direction of rotation of the base or sheet member.

Moreover, all the curved lines may be made to protrude forwards in a direction of the rotation of the base or the sheet member.

In the seventh embodiment of the present invention, the cleaning rotary brush of the fifth or sixth embodiment is characterized in that the phantom setting lines are a curved line protruding in one direction, and the crossing angle between a line passing through the center of rotation and an arbitrary point on the phantom setting line and a tangent to the curved line at the arbitrary point approaches 90° as the arbitrary point goes away from the center of rotation.

In the seventh embodiment, the crossing angle may be changed in a range of 0° to 45°.

When a portion to be cleaned is cleaned using the cleaning rotary brush of each of the embodiments discussed above, the ridged projections rotating at a high speed by the rotating shaft are forced against the portion to be cleaned at the same time water or other cleaning liquid is supplied over the portion to be cleaned. By doing this, the portion to be cleaned is scrub-cleaned effectively by means of the ridged projections made of PVAt porous elastomer. Then, the dirt or particles scrubbed from the portion to be cleaned move together with the spent cleaning liquid to the outer periphery side and are finally drained off to outside of the system.

At this time, as the ridged projections continually extend from the inner reference points on the side of the center of rotation of the working surface or sheet member to the outer reference points on the side of the outer periphery, the spent cleaning liquid containing the dirt or particles scrubbed from the portion to be cleaned receives a centrifugal force and is adequately guided to the outer reference points. Thus, the spent cleaning liquid is rapidly drained off to the outside of the system and the residence time of the dirt or particles are remarkably reduced.

BRIEF DESCRIPTION OF THE DRAWINGS

FIG. 1 shows a plan view of a cleaning rotary brush of the first embodiment in accordance with the present invention.

FIG. 2 shows a sectional view taken on line II—II of FIG. 1.

FIG. 5 shows a plan view of a cleaning rotary brush of the fourth embodiment in accordance with the present invention.

FIG. 6 shows a plan view of a cleaning rotary brush of the fifth embodiment in accordance with the present invention.

THE BEST MODE OF THE EMBODIMENTS OF THE PRESENT INVENTION

Figure 3:
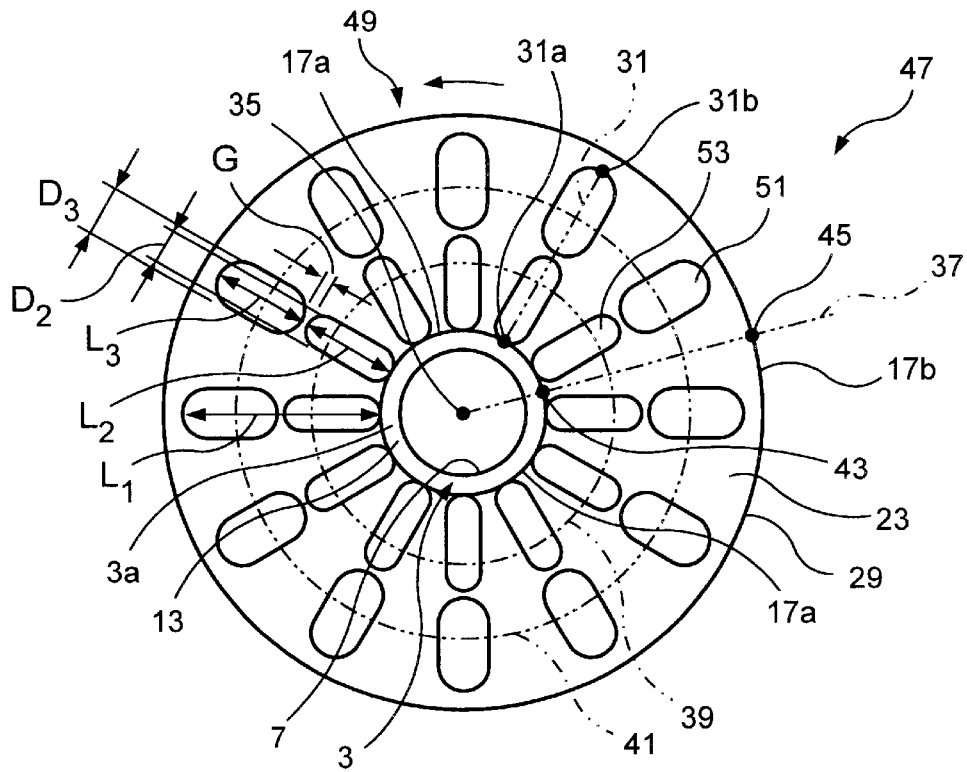
FIG. 3 shows a plan view of a cleaning rotary brush of the second embodiment in accordance with the present invention.

The first embodiment of the present invention will be described hereinafter in connection with FIGS. 1 and 2.

FIG. 1 shows a plan view of a cleaning rotary brush of the first embodiment, and FIG. 2 shows a cross sectional view taken on line II—II of FIG. 1.

As shown in FIGS. 1 and 2, a rotary brush 1 is provided with a hard base 3 made of generally a circular disk like shaped metal or resin and a brush body attached to the base 3.

Base 3 has a circular hole 7 formed about its center. The base 3 is detachably fastened to an end surface 9a of a rotary shaft 9 with a bolt 11 being inserted through the circular hole 7, and is rotating together with the rotary shaft 9. Peripheral portions 13, 15 of the circular hole 7 of the front side 3a and back side 3b of the hollow disk like base 3 abut respectively on bolt 11 and rotary shaft 9. Outer portions of the front side 3a and back side 3b of the base 3 outside the peripheral portions 13, 15 of circular hole 7 form doughnut-surface shaped working surfaces 17, 19 rotating in substantially the same plane with the base 3 attached to the rotary shaft 9. As shown in FIG. 2, when base 3 is attached to the rotary shaft 9, the working surface 17 of the front side 3a is placed opposite the surface of an object to be cleaned 21, and when the base 3 is attached to the rotary shaft 9 in reverse with that shown in FIG. 2, the working surface 19 of the back side 3b is placed opposite the surface of an object to be cleaned 21.

The brush body 5 comprises two thin disk like sheets 23, 25 of the same shape, a plurality (12 in number in the present embodiment) of ridged projections 27 projecting as cleaning members from the respective sheets 23, 25, and a side edge portion 29 connecting the outer peripheral portions of both sheets 23, 25 together throughout the entire circumstance. Both sheet members 23, 25, ridged projections 27, and side edge portion 29 are integrally formed of a polyvinyl acetal (PVAt) porous elastomer, which is elastic in wet condition. One of the sheets 23 covers the working surface 17 of the front side 3a and the other sheet 25 covers the working surface 19 of the back side 3b of the base 3, and the side edge 29 covers the peripheral side edge of the base 3.

Ridged projections 27 each are placed continually on one of the plural (12 in number) phantom setting lines 31 which extend straight from an inner reference point 31a on the side of the center of rotation 35 of the working surface 17 and the sheet 23 up to an outer reference point 31b on the side of the periphery of the working surface 17 and sheet 23. Incidentally, with regard to the working surface 19, too, ridged projections 27 are placed continually on phantom setting lines, which are set in the same manner as the working surface 17, and the shape thereof is the same as that of the ridged projections 27 on the working surface 17, and therefore the detailed description thereof is omitted.

The phantom setting lines 31 pass through the center of rotation 35 of the working surface 17 and sheet 23, and lie in radial lines which divide the circumference around the center of rotation 35 into twelve equal sections. The reference point 31a is set further inside an inner circle 39 of two concentric circles 39, 41 (referred hereinafter to as reference concentric circles) and adjacent to the innermost edge 17a, where the two concentric circles trisect the distance between the intersections 43 and 45 of lines 37 passing through the center of rotation 36 respectively with the innermost edge 17a and outermost edge 17b of the working surface 17. The outer reference point 31b is set further outside the outer circle 41 of the two reference concentric circles 39, 41 and adjacent to the outermost edge 17b of the working surface 17.

Incidentally, the inner reference point 31a may be set further inside the inner circle of the two concentric circles which trisect the distance between the intersections of lines 37 passing through the center of rotation 35 respectively with the innermost edge 23a and outermost edge 23b of the sheet 23, and the outer reference point 31b may be set further outside the outer circle of the two circles. However in the present embodiment the innermost edge 23a and outermost edge 23b of the sheet 3 are located respectively nearly above the innermost edge 17a and outermost edge 17b of the working surface 17, and therefore two concentric circles based on the sheet 23 are substantially in agreement with the two reference concentric circles 39, 41 on the working surface 17.

The ridged projections 27 are formed generally elliptical in a plane view, generally semicircle in cross-section in a widthwise direction, and generally rectangular in cross-section in a longitudinal direction, and the line opposite the bottom line of the cross-section in a longitudinal direction form the tops which are in contact with the surface of an object to be cleaned.

Each of the ridged projections 27 is formed with a length, L1 in a longitudinal direction along the phantom setting line (the length of the phantom setting line 31) being longer than a length, D1, in a width-wise direction perpendicular to the phantom setting line 31. The ridged projections 27 each are generally at the same height in projection, and the tops of the ridged projections 27 come into contact with the surface of an object to be cleaned 21 while rotating substantially in the same plane. In view of cleaning efficiency, length, L1, in a longitudinal direction is preferably more than twice the length D1 in a widthwise direction (L1>2±D1), the length D1 in a widthwise direction is preferably in a range of ½₀ to ⅒ of the diameter of the working sheet 17 or sheet 23, and the height H of the ridged projections 27 is preferably less than or equal to the length D1 in a widthwise direction, and however these values should not be limited to those ranges indicated above. Incidentally, if in the working sheet 17 or sheet 23 there is a big difference between the area where are formed the ridged projections in contact with the surface of an object to be cleaned and the area of the flat portions over which cleaning liquid flows, a cleaning efficiency could be lower. In this regard, the entire area where all the ridged projections 27 occupy compared to the whole area of the working sheet 17 or sheet 23 is preferably more than or equal to 20% and less than or equal to 60%, and is more preferably more than or equal to 30% and less than or equal to 50%.

For a method for preparing PVAt porous elastomer, one or more sorts of polyvinyl alcohols having average polymerization degree of 300~2000 and a saponification degree of more than or equal to 80% are mixed into an aqueous solution, to which are added aldehydes as a cross-linking agent, mineral acid as catalyst, and starches as pore forming materials, and the mixed solution is poured into a given mold and reacted at a temperature of 50~80° C., and then it is taken out from the mold, and it should however not be limited to this method. Incidentally, after the completion of the reaction, PVAt porous elastomer is used after it is taken out from the mold and rinsed with pure water free of impurities such as particles, ions, organic materials, which would be solved and suspending in water.

In the present embodiment, while the base 3 is held in the mold in advance, the mixed solution is poured into the mold and reacted thereby forming integrally the base 3 and brush body 5. Thus the brush body 5 is held on the base 3 without using any adhesive, or the like. Besides, the brush body 5 may be formed not integrally with the base 5, and instead one sheet 23 and the other sheet 26 may be formed separately, for instance, and the respective sheets 23, 25 may be bonded to the base 3 with an adhesive or the like.

The PVAt porous elastomer prepared by the method mentioned above is hardened in dry conditions and softened in wet conditions. Additionally it shows excellent absorption and water-holding properties, desirable flexibility and moderate repulsive elasticity in wet conditions, and excellent abrasion- resistance.

Furthermore, PVAt porous elastomer forming the brush body 5 has preferably a porosity of 80% to 95%, an average pore diameter of 30μm to 250 μm, and 30% compressive stress of 15 g/cm$^2$~150 g/cm$^2$ when containing 250%~400% of water relative to dry weight (this condition is referred hereinafter to as an adequate water containing condition).

If the porosity is less than 80%, the flexibility is insufficient in a wet state, and if the porosity is more than 95%, the practical strength is weak, and in any of the cases, it is not suitable for use in cleaning. Moreover, if the average pore diameter is less than 30 μm, the elasticity in wet condition is not enough to get sufficient cleaning effect, and if it is beyond 250 μm, mesh is rough, and therefore it is not suitable for minute cleaning.

The porosity is defined herein as the value being calculated by following equation (1) followed by a measurement, using a dry-typed automatic densimeter, of a rectangular solid of PVAt porous elastomer, which was fully dried up with a dryer to obtain an apparent volume and absolute volume of the rectangular solid $$\text{Porosity (\%)} = (\text{apparent volume} - \text{absolute volume})/\text{apparent volume} * 100 \quad (1)$$

The average pore diameter is the value determined by a mercury-injection pore measurement using a mercury porosimeter manufactured by PORUS MATERIALS, INC.

Incidentally, the value of 30% compressive stress is determined by setting PVAt porous elastomer in an adequate water containing condition in a digital load gauge with a load being applied upon the entire end surface, measuring the load when compressed by 30%, and dividing the measured load by the area of the end surface.

Next the operation of the present embodiment will be described.

When the surface of an object to be cleaned 21 is cleaned with rotary brush 1, ridged projections 27 rotating at a high speed by rotary shaft 9 are pressed against the to be cleaned surface of an object while water or other cleaning liquid is supplied on the surface of an object to be cleaned 21. Thus the entire region of the surface of an object to be cleaned 21 is scrub-cleaned by the ridged projections 27 made of PVAt porous elastomer. Then dirt or particles scrubbed from the surface of an object to be cleaned 21 move over the surface of an object to be cleaned 21 together with the spent cleaning liquid to its outer periphery, and are finally drained off to the outside of the system (outside the surface of an object to be cleaned 21).

At that time, the spent cleaning liquid containing dirt or particles scrubbed from the surface of an object to be cleaned 21 receives a centrifugal force and is guided by the ridged projections 27 and led adequately to outer reference point 31b, since the ridged projections 27 continually extend from inner reference point 31a on the side of the rotation center 36 of working surface 17 and sheet 23 to outer reference point 31b on the side of the outer periphery Thus, the spent cleaning liquid is quickly drained off from the surface of an object to be cleaned 21 to the outside of the system, and the residence time of the dirt or particles can be remarkably reduced.

Accordingly, recontamination- on the surface of an object to be cleaned 21 of the dirt or particles in the spent cleaning liquid is surely prevented. Furthermore, even if residing particles are hard material such as grit, the occurrence of scratches on the surface of an object to be cleaned 21 could be more reliably prevented.

As described above, with the rotary brush 1 in accordance with the present embodiment, dirt, and the like scrubbed from the surface of an object to be cleaned can be quickly drained off to the outside of the system, and thus the rotary brush 1 is made to have more excellent cleaning efficiency.

Incidentally, in case where both the front and back surfaces of a flat object to be cleaned are washed, two rotary brushes are positioned generally in parallel, between which the object to be cleaned is interposed so that both the surfaces of an object to be cleaned are washed simultaneously. Further, a plurality of rotary brushes are positioned generally in parallel at a fixed interval, and a plurality of objects to be cleaned are interposed therebetween so that both surfaces of a number of objects to be cleaned can be washed simultaneously. Following is the second embodiment to be described in connection with FIG. 3. FIG. 3 is a plan view of a cleaning rotary brush in accordance with the second embodiment. Incidentally in the second through seven embodiments to be described hereinafter, phantom setting lines 31 and/or ridged projections 27 in the first embodiment are modified in their shapes, or other components are added, and therefore the components similar to those in the first embodiments are marked with like reference numbers, and the detailed description thereof will be omitted.

As shown in FIG. 3, brush body 49 of rotary brush 47 in accordance with the present embodiment is provided with two separate ridged projections in place of the ridged projection 27 in the first embodiment. The two ridged projections 51, 53 are continually provided on each of the phantom setting lines 31, and the length D2 in a widthwise direction of the ridged projection 51 on the side of the center of rotation 35 is formed shorter than the length D3 in a widthwise direction of the outer ridged projection 53. In case of such separated ridged projection 51, 53 being used, the word continually means that a gap G in a longitudinal direction between the two ridged projections 61, 53 is set shorter than any of the lengths D2 and D3 in a widthwise direction respectively of the ridged projections 51 and 53. Furthermore, the lengths L2 and L3 in a longitudinal direction respectively of the ridged projections 51 and 53 are made longer than the lengths D2 and D3 in a widthwise direction, and the respective ridged projections 51, 53 are at substantially the same projection heights.

Inner reference point 31a of the phantom setting line 31 in alignment with the innermost edge of the ridged projection 53 on the side of rotation center 35 is set further inside the inner circle 39 of the two reference concentric circles 39, 41 and is adjacent to the innermost edge 17a of the working surface 17. Outer reference point 31b of the phantom setting line 31 in alignment with the outermost edge of the outer ridged projection 51 is set further outside the outer circle 41 of the two reference concentric circles 39, 41, and is adjacent to the outermost edge 17b of the working surface 17.

According to the present embodiment, in the same manner as the first embodiment, the spent cleaning liquid containing dirt or particles is guided by the continually extending ridged projections 51, 53 and led adequately to the outer reference point 31b, and is rapidly drained off to the outside of the system, and therefore it can provide a rotary brush 47 having more excellent cleaning efficiency.

Figure 4:
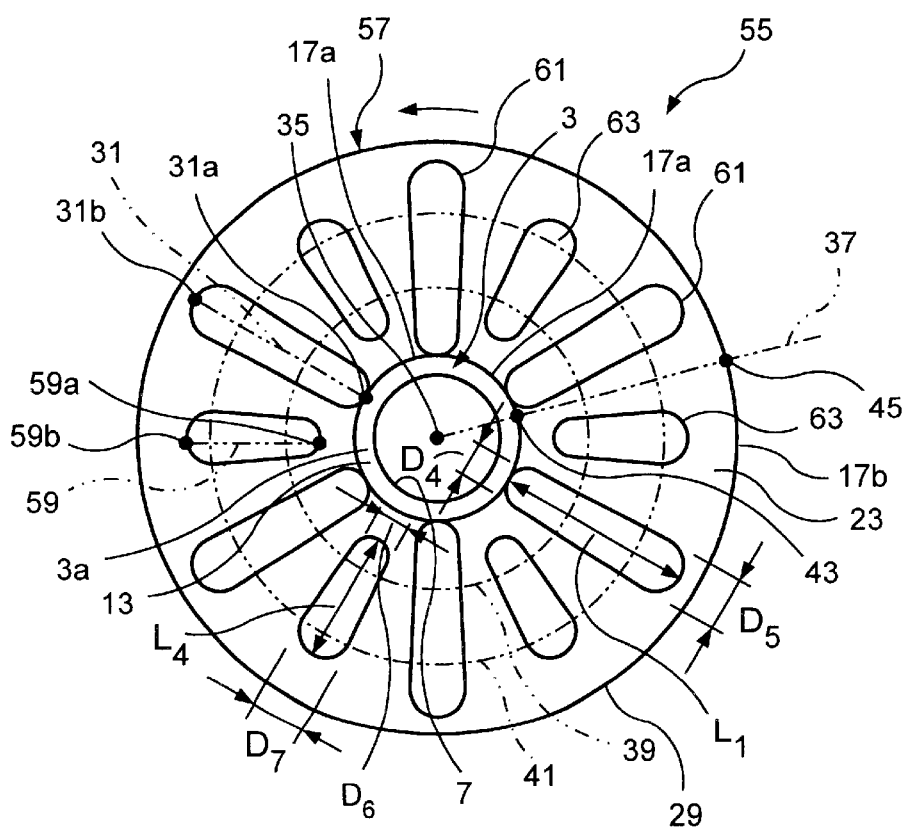
FIG. 4 shows a plan view of a cleaning rotary brush of the third embodiment in accordance with the present invention.

Next, the third embodiment of the present invention will be described in connection with FIG. 4. As shown in FIG. 4, in the brush body 57 of a rotary brush 55 in accordance with the present embodiment, six phantom setting lines, every other lines of the twelve phantom setting lines 31 in the first embodiment, are replaced with six straight phantom setting lines 59 having a shorter length L4 (L4∠L1), and ridged projections 61, 63 have different lengths in a widthwise direction varying with the position on the phantom setting lines 31, 59.

The phantom setting lines 31 and 59 are positioned alternately. The inner reference point 59a of the phantom setting line 59 is positioned outward from the inner reference point 31a of the phantom setting line 31, and the outer reference point 59b is positioned inward from the outer reference point 31b. Additionally, the inner reference point 59a of the phantom setting line 59 is set further inward from the inner circle 39 of the two reference concentric circles 39, 41, and the outer reference point 59b is set further outward from the outer circle 41.

The ridged projections 61 are arranged on the phantom setting lines 31 and formed with the widths being gradually broader as it is away from the center of rotation 35, so that length D4 in a widthwise direction thereof is a minimum at the inner reference point 31a and length D5 in a widthwise direction is a maximum at the outer reference point 31b. Similarly, the ridged projections 63 are arranged on phantom setting lines 59 and formed with the widths being gradually broader as it is away from the center of rotation 35, so that length D6 in a widthwise direction thereof is a minimum at the inner reference point 59a and length D7 in a widthwise direction is maximum at the outer reference point 59b. Incidentally, the longitudinal lengths L1, L4 of the respective ridged projections are formed respectively longer than the minimum lengths D4, D6, and the respective ridged projections 61, 63 are at substantially the same heights in projection.

In accordance with the present embodiment, in the same manner as the first embodiment, the spent cleaning liquid containing dirt or particles is guided by the continually extending ridged projections 61, 63 and is led adequately to the outer reference points 31b, 59b and is quickly drained off to the outside of the system, and therefore it can provide a rotary brush 65 having more excellent cleaning efficiency.

Next, the fourth embodiment of the present invention will be described in connection with FIG. 5. FIG. 6 is a plan view of a cleaning rotary brush in accordance with the fourth embodiment.

As shown in FIG. 5, in the brush body 67 of a rotary brush 65 in accordance with the present embodiment, six ridged projections, positioned on every other line, of the twelve ridged projections 27 of the first embodiment are removed, and there are arranged a plurality of projections 69 in the shape of, for example, a cylinder, hemisphere, etc. instead of a ridged shape, on the sheets 23 between the remaining ridged projections 27. That is, the cleaning members comprise the ridged projections 27 and projections 69.

According to the present embodiment, in addition to the cleaning effect due to the projections 69, the spent cleaning liquid is guided by the ridged projections 27 to be quickly drained off to the outside of the system, and therefore it can provide a rotary brush 65 having more excellent cleaning efficiency in the same manner as the first embodiment.

Next, the fifth embodiment of the present invention will be described in connection with FIG. 6. FIG. 6 is a plan view of a cleaning rotary brush in accordance with the fifth embodiment.

As shown in FIG. 6, the brush body 73 of a rotary brush 71 in accordance with the present embodiment is provided with ridged projections 77 on twelve straight phantom setting lines 75 which are at a slant with respect to the lines passing through the center of rotation 35.

The inner reference points 75a of the phantom setting lines 75 are set at regular intervals on the circumference around the center of rotation 35. The inner reference points 75a are set further inward from the inner circle 39 of the two concentric circles 39, 41 and adjacent to the innermost edge 17a of the working surface 17. The outer reference points 75b are set further outward from the outer circle 41 and adjacent to the outermost edge 17b of the working surface 17.

Crossing angle θ1 between each of the phantom setting lines 75 and a line 79 is set at 30°, where the line 79 passes through the center of rotation 35 and the midpoint 7c that bisects the distance between the inner and outer reference points 75a and 75b of the phantom setting line 76. Incidentally, if the crossing angle θ1 is in a range of 0° to 45°, it will do well.

The phantom setting lines 76 are all at a slant backward in a direction of the rotation of the base 3 and sheets 23.

Furthermore, the longitudinal length L8 of the ridged projections 77 along the phantom setting line 75 is formed longer than the length D8 in a widthwise direction, and the ridged projections 77 each are at substantially the same height in projection.

In accordance with the present embodiment, the spent cleaning liquid is guided by the ridged projections 77 to be rapidly drained off to the outside of the system in the same manner as the first embodiment, and therefore it can provide a rotary brush 73 having more excellent cleaning efficiency.

Figure 7:
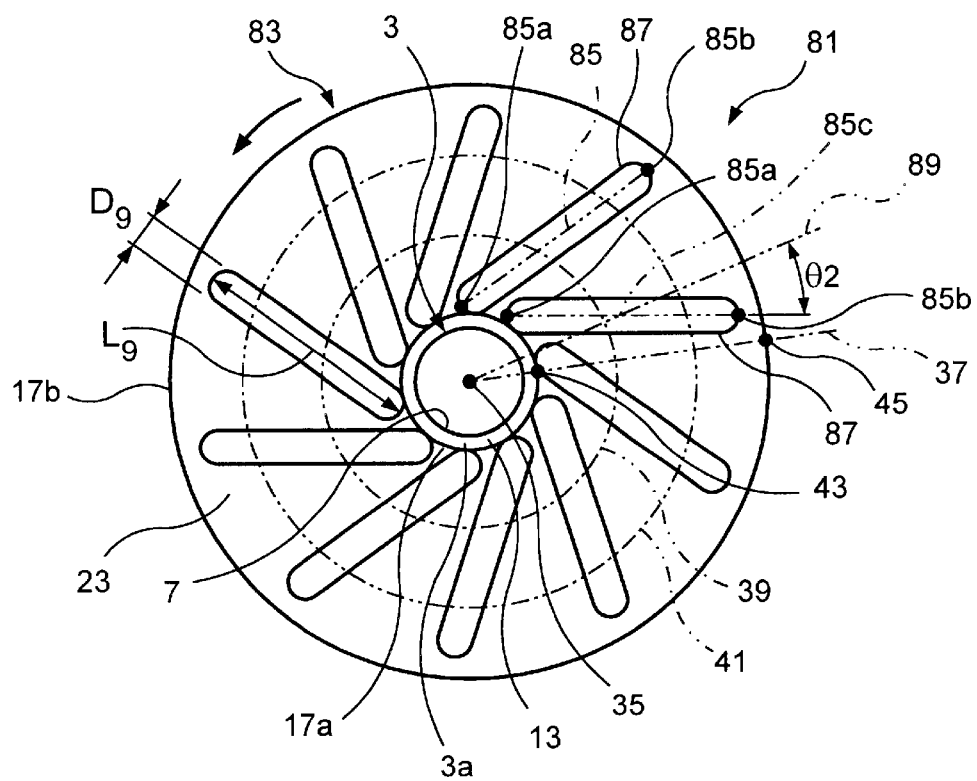
FIG. 7 shows a plan view of a cleaning rotary brush of the sixth embodiment in accordance with the present invention.

Next, the sixth embodiment of the present invention will be described in connection with FIG. 7. FIG. 7 is a plan view of a cleaning rotary brush in accordance with the sixth embodiment.

As shown in FIG. 7, the brush body 83 of a rotary brush 81 in accordance with the present embodiment has much the same construction as the fifth embodiment except for the length of the phantom setting lines 85, the number of the lines, and the slant angle.

Namely, the phantom setting lines 85 (ridged projections 87) are ten in number, and crossing angle θ2 between each of the phantom setting lines 85 and a line 89 is set at 45°, where the line 89 passes through the center of rotation 35 and the midpoint 8c that bisects the distance between the inner and outer reference points 85a and 85b of the phantom setting line 85. The inner reference points 86a of the phantom setting lines 85 are set at regular intervals on the circumference around the center of rotation 35. The inner reference points 85a are set further inward from the inner circle 39 of the two concentric circles 39, 41 and adjacent to the innermost edge 17a of the working surface 17. The outer reference points 85b are set further outward from the outer circle 41 of the two concentric circles 39, 41 and adjacent to the outermost edge 17b of the working surface 17.

The phantom setting lines 85 are all equally at a slant backward in a direction of the rotation of the base 3 and sheets 23. The longitudinal length L9 of the ridged projections 87 is formed longer than the length D9 in a widthwise direction, and the ridged projections each have substantially the same heights in projection.

In accordance with the present embodiment, the spent cleaning liquid is guided by the ridged projections 87 to be rapidly drained off to the outside of the system in the same manner as the first embodiment, and therefore it can provide a rotary brush 83 having more excellent cleaning efficiency.

Figure 8:
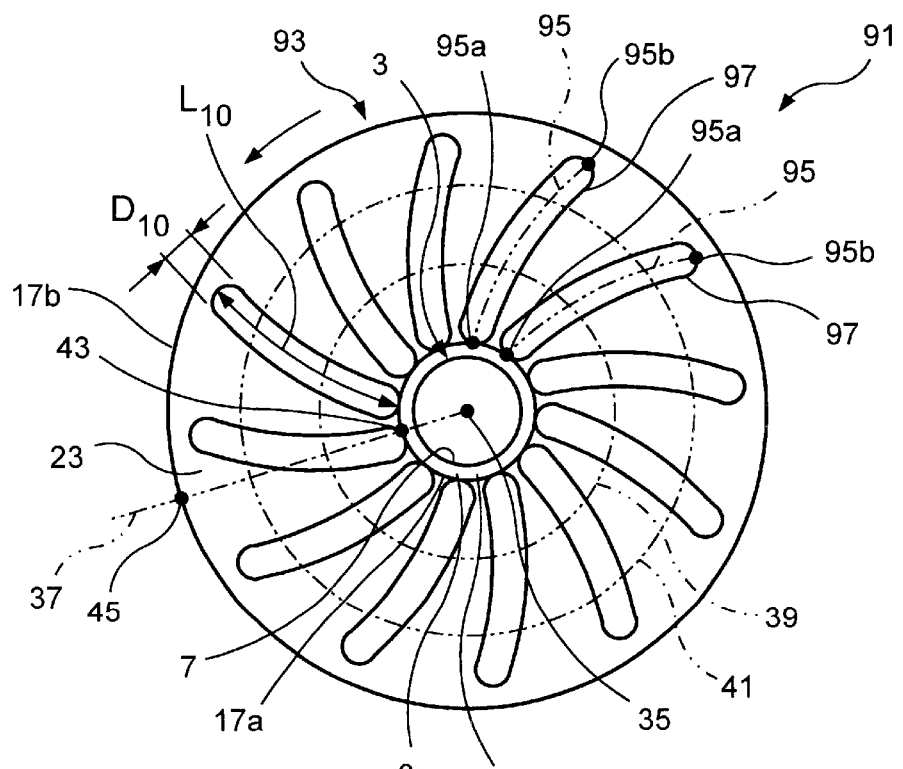
FIG. 8 shows further a plan view of a cleaning rotary brush of the seventh embodiment in accordance with the present invention.
Figure 9:
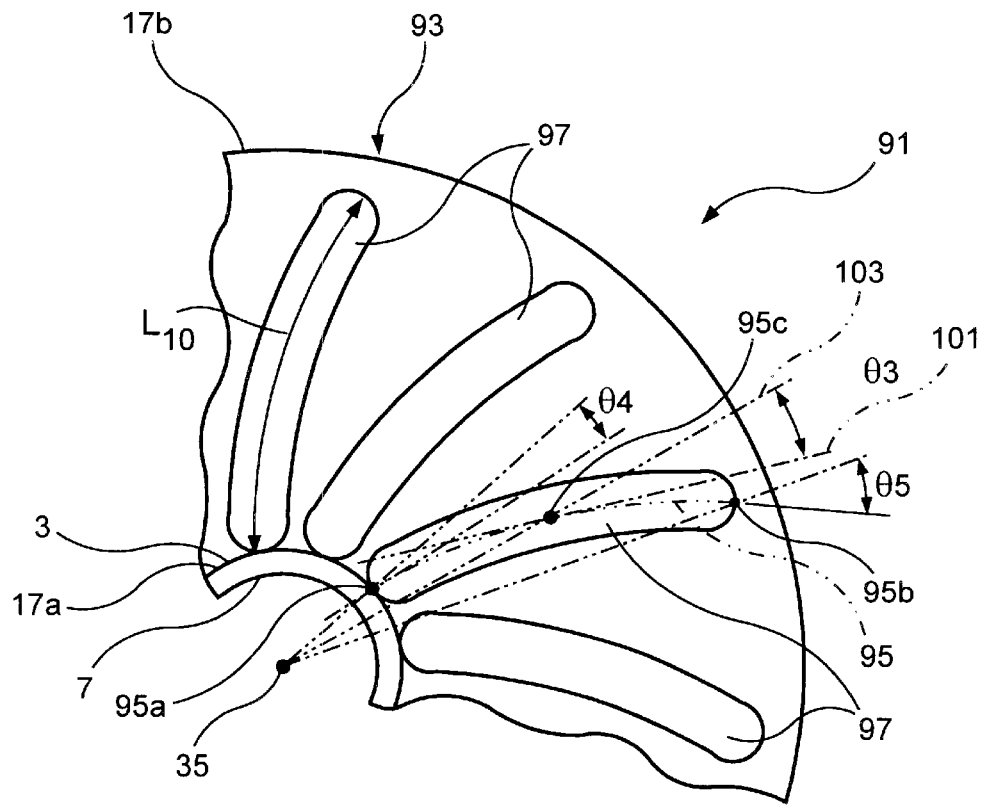
FIG. 9 is an enlarged view of the essential portion in FIG. 8.

Next, the seventh embodiment of the present invention will be described in connection with FIGS. 8 and 9. FIG. 8 is a plan view of a cleaning rotary brush in accordance with the seventh embodiment, and FIG. 9 is an enlarged view of the essential portion in FIG. 8.

As shown in FIG. 8, the brush body 93 of a rotary brush 91 in accordance with the present embodiment is provided with twelve curved (curvilinear) phantom setting lines 95 protruding in one direction instead of the straight phantom setting lines 76 of the fifth embodiment.

The inner reference points 95a of the phantom setting lines 95 are located at regular intervals on the circumference around the center of rotation 35. The inner reference points 96a are set further inward from the inner circle 39 of the two concentric circles 39, 41 and adjacent to the innermost edge 17a of the working surface 17. The outer reference points 95b are set further outward from the outer circle 41 of the two concentric circles 39, 41 and adjacent to the outermost edge 17b of the working surface 17.

The longitudinal length L10 of the ridged projections 97 along the phantom setting line 95 is formed longer than length D10 in a widthwise direction along a direction normal to the phantom setting line 95, and the ridged projections 97 each have substantially the same projection height.

As shown in FIG. 9, a tangent 101 to the phantom setting line 95 at the midpoint 9c which bisects the length along the phantom setting line 95 between the inner and outer reference points 95a and 95b (the longitudinal length L10 of the ridged projection 97) is at a slant with respect to a line 103 which passes through the center of rotation 35 and midpoint 9c. The crossing angle θ3 between the line 103 and tangent 101 in a range of 0° to 45° is satisfactory, and in the present embodiment it is set at 20°.

Incidentally, the crossing angle between a line passing through the center of rotation 35 and an arbitrary point in the phantom setting line 95 and a tangent 95 to the phantom setting line 95 at the arbitrary point varies approaching 90° as the arbitrary point goes away from the center of rotation 35. The crossing angle preferably varies in a range of 0° to 45°, and in the present embodiment the crossing angle θ4 at the inner reference point 95a is set at 10°, the crossing angle θ3 at the midpoint is 20° as mentioned above, and the crossing angle θ5 at the outer reference point 95b is 30°

Additionally, all the phantom setting lines 95 are equally at a slant backward in a direction of the rotation of the base 3 and sheets 23, and protrude forward in a direction of the rotation of the base 3 and sheets 23.

In accordance with the present embodiment, the spent cleaning liquid is guided by the ridged projections 97 to be rapidly drained off to the outside of the system in the same manner as the first embodiment, and therefore it can provide a rotary brush 93 having more excellent cleaning efficiency.

Figure 10:
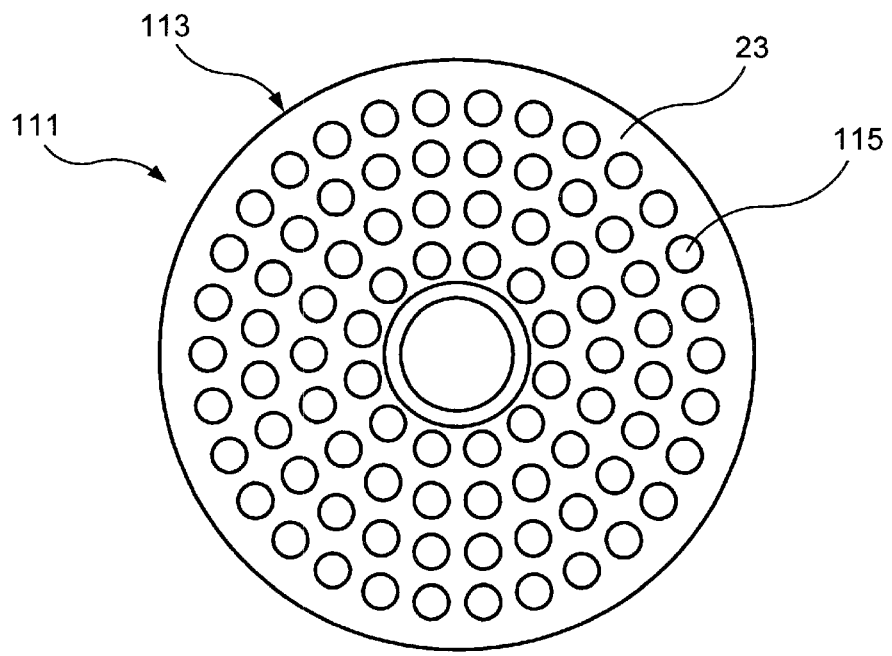
FIG. 10 also shows a plan view of a sample for comparison.

Next, the samples A, B, C, and D respectively of the brushes 1, 71, 81, 91 relating to the first, fifth, sixth, and seventh embodiments were prepared together with a comparison sample E of a rotary brush 111 as shown in FIG. 10, for which samples the cleaning tests were carried out, and the test results will be described below in connection with Table 1.

TABLE 1

| Sample | Shape of Phantom Setting Line | Shape of Projection | Number of Projection | Time Needed for Cleaning |
|---|---|---|---|---|
| A | Straight<br>Slant Angle of Phantom Setting Line: 0° | Ridged | 12 | 0.8 |
| B | Straight<br>Slant Angle of Phantom Setting Line at Middle Point: 30° | Ridged | 12 | 0.6 |
| C | Straight<br>Start Angle of Phantom Setting Line at Middle Point: 45° | Ridged | 10 | 0.7 |
| D | Curvilinear<br>Slant Angle of Tangent to Phantom Setting Line: 10–30° | Ridged | 12 | 0.4 |
| E | — | Cylindrical | 60 | 1.0 |

The brush bodies 5, 73, 83, 93, and 113 of Samples A~D and comparison sample E were made of PVAt porous elastomer having a porosity of about 90% and an average pore diameter of about 150 μm, and the outside diameter of the sheet 23 was 60 mm. Furthermore, the outside diameter of the working surface 17 was formed slightly smaller than the outside diameter of the sheet 23.

Of the ridged projections 27, 77, 87, and 97 of the samples A~D, the lengths of D1, D8, D9, and D10 in a widthwise direction were set at 10 mm, the longitudinal length L1, L8, L9, L10 at 23 mm, and the height at 6 mm.

The projections 115 of the comparison sample E were cylindrical with the diameter of 10 mm, the height of 6 mm, and a total of 60 projections, and they were positioned in nearly constant density on the sheets 23.

The space occupation factors of the area of the ridged projections 27, 77, 87, and 97 and projections 115 of the samples A~D and comparison sample E with respect to the sheet 23 were all about 40%.

The cleaning tests for each of the samples A~E were carried out by cleaning the surface of an aluminum disk for a diskette. The detailed test conditions are as follows:

The aluminum disk to be used was underwent final grinding with free grit, and was roughly washed by means of a flow of water. A cleaning liquid was pure water having particle controlled. There were water ejection holes, not shown in the drawings, provided adjacent to the center of rotation of the respective rotary brushes 1, 71, 81, and 91, from which water ejection holes a cleaning liquid was fed onto the aluminum disk. The rate of rotation of the rotary shaft 9 was 100 rpm, and the junction pressure between each of the ridged projections 27, 77, 87, and 97 and the aluminum disk was about 10 g/cm$^2$. The evaluation of the cleaning tests was performed by measuring the cleaning time needed when each of the samples A~E was used, calculating the relative value of the cleaning time for the respective samples A~D where the cleaning time for the comparison sample E was assumed at 1, and comparing those values. The cleaning time was the time from the starting of the cleaning to the reaching of the cleaning completed state where the cleaning completed state was assumed as the state when the number of the particles contained in the cleaning liquid drained from the aluminum disk came to under the predetermined number.

The results showed that in any case of the samples A to E used, the cleaning time needed was shorter than that in case of the sample E with the good cleaning efficiency.

Additionally, in any of the samples A to E used, there was no scratch made on the aluminum disk after cleaned.

Incidentally, although the rotary brushes 1, 47, 65, 65, 71, 81, and 91 were constructed with the base 3 and brush bodies 5, 49, 57, 67, 73, 83, and 93, the rotary brushes may be constructed with the brush bodies 5, 49, 57, 67, 73, 83, and 93 only In the case of the base 3 omitted, the sheet 23 may be attached on a rotatable working surface with an adhesive, etc.

Moreover, a rotary brush may be constructed without a sheet 23. In this case the ridged projections 27, 51, 61, 63, 77, 87, and 97 may be disposed directly on the working surface 17 of the base 3 with an adhesive, etc.

Furthermore, the ridged projections 27, 51, 61, 63, 77, 87, and 97 may be configured in rectangular shape in a plane view, a polygon such as generally a triangle, rectangular, in cross section in a widthwise direction with their corners being rounded, and generally a trapezoidal cross section in a longitudinal direction

INDUSTRIAL USABILITY

As described above, in accordance with the present invention, the spent cleaning liquid containing dirt or particles scrubbed from the object to be cleaned is guided by the ridged projections and is led adequately to outer reference points and is rapidly drained off to the outside of the system, and the residence time of the dirt or particles can be remarkably reduced.

Accordingly, recontamination on an object to be cleaned of the dirt or particles in the cleaning spent liquid is surely prevented. Moreover, even if residing particles are hard material such as grit, the occurrence of scratch on the object to be cleaned could be more reliably prevented.

What is claimed is:

1. A cleaning rotary brush comprising a hard base having a rotating working surface opposite an object to be cleaned while mounted to a rotary shaft, and one or more cleaning members projecting from the working surface, the tops of said cleaning members being in contact with said object to be cleaned while rotating in substantially the same plane, wherein:

said cleaning members are made of a polyvinyl acetal porous elastomer and are formed as ridged projections positioned continually from inner reference points on the side of the center of rotation of the working surface to outer reference points on the side of the outer periphery of the working surface on each of a plurality of phantom setting lines extending from said inner reference points to said outer reference points, wherein a length in a longitudinal direction of said ridged projections along said phantom setting lines is formed longer than a length in a widthwise direction of the ridged projections, wherein said inner reference points are adjacent to an innermost edge of the working surface, wherein said outer reference points are adjacent to an outermost edge of the working surface, wherein a total area occupied by all of said cleaning surfaces accounts for 20 to 60% of a total area of said working surface, wherein said phantom setting lines are generally straight and extend at an angle to a first reference line passing through said center of rotation of said working surface and extending toward the outermost edge of said working surface in a reverse direction of the rotation of said working surface, and wherein a second reference line extending from said first reference line bisects said phantom setting lines to define a crossing angle of at most 45 degrees between said second reference line and said phantom setting lines such that said phantom setting lines extend in relation to said crossing angle.

2. A cleaning rotary brush comprising a sheet member mounted on and rotating in unity with a rotating working surface opposite an object to be cleaned, and one or more cleaning members projecting from the sheet member, the top of said cleaning members rotating in substantially the same plane in contact with the object to be cleaned, wherein:

said cleaning members are made of a polyvinyl acetal porous elastomer and are formed as ridged projections positioned continually from inner reference points on the side of the center of rotation of the sheet member to outer reference points on the side of the outer periphery of the sheet member on each of a plurality of phantom setting lines extending from said inner reference points to said outer reference points, wherein a length in a longitudinal direction of said ridged projections along said phantom setting lines is formed longer than a length in a widthwise direction of said ridged projections, wherein said inner surface points are adjacent to an innermost edge of the sheet member, wherein said outer reference points are adjacent to an outermost edge of the sheet member, wherein a total area occupied by all of said cleaning members accounts for 20 to 60% of a total area of said working surface, wherein said phantom setting lines are generally straight and extend at an angle to a first reference line passing through said center of rotation of said sheet member and extending toward the outermost edge of said sheet member in a reverse direction of the rotation of said sheet member, and wherein a second reference line extending from said first reference line bisects phantom setting lines to define a crossing angle of at most 45 degrees between said second reference line and said phantom setting lines such that said phantom setting lines extend in relation to said crossing angle.

3. A cleaning rotary brush comprising a hard base having a rotating working surface opposite an object to be cleaned while mounted to a rotary shaft, and one or more cleaning members projecting from the working surface, the tops of said cleaning members being in contact with said object to be cleaned while rotating in substantially the same plane, wherein:

said cleaning members are made of a polyvinyl acetal porous elastomer and are formed as ridged projections positioned continually from inner reference points on the side of the center of rotation of the working surface to outer reference points on the side of the outer periphery of the working surface on each of a plurality of phantom setting lines extending from said inner reference points to said outer reference points, wherein a length in a longitudinal direction of said ridged projections along said phantom setting lines is formed longer than a length in a widthwise direction of the ridged projections, wherein said inner reference points are adjacent to an innermost edge of the working surface, wherein said outer reference points are adjacent to an outermost edge of the working surface, wherein a total area occupied by all of said cleaning members accounts for 20 to 60% of a total area of said working surface, wherein said phantom setting lines are curved with the curve protruding in the direction of the rotation of said working surface and are at an angle to a first reference line passing through said center of rotation of said working surface and extending toward the outermost edge of said work surface in a reverse direction of the rotation of said working surface, wherein a second reference line is tangential to the curved phantom setting lines at a midpoint of said length of said ridged projections, and wherein a third reference line extending from the end of said first reference line at said center of rotation and through the tangent point of said second reference line defines a crossing angle approaching- 90° between said third reference line and said second reference line such that said phantom setting lines extend in relation to said second reference line based on said crossing angle.

4. A cleaning rotary brush comprising a sheet member mounted on and rotating in unity with a rotating working surface opposite an object to be cleaned, and one or more cleaning members projecting from the sheet member, the top of said cleaning members rotating in substantially the same plane in contact with the object to be cleaned, wherein:

said cleaning members are made of a polyvinyl acetal porous elastomer and are formed as ridged projections positioned continually from inner reference points on the side of the center of rotation of the sheet member to outer reference points on the side of the outer periphery of the sheet member on each of a plurality of phantom setting lines extending from said inner reference points to said outer reference points, wherein a length in a longitudinal direction of said ridged projections along said phantom setting lines is formed longer than a length in a widthwise direction of the ridged projections, wherein said inner reference points are adjacent to an innermost edge of the sheet member, wherein said outer reference points are adjacent to an outermost edge of the sheet member, wherein a total area occupied by all of said cleaning members accounts for 20 to 60% of a total area of said sheet member, wherein said phantom setting lines are curved with the curve protruding in the direction of the rotation of said sheet member and are at an angle to a first reference line passing through said center of rotation of said sheet member and extending toward the outermost edge of said sheet member in a reverse direction of the rotation of said sheet member, wherein a second reference line is tangential to the curved phantom setting lines at a midpoint of said length of said ridged projection, and wherein a third reference line extending from the end of said first reference line at said center of rotation and through the tangent point of said second reference line defines a crossing angle approaching 90° between said third reference line and said second reference line such that said phantom setting lines extend in relation to said second reference line based on said crossing angle.

5. A cleaning rotary brush according to claim 1 or 2, wherein said ridged projections are made of a polyvinyl acetal porous elastomer having a porosity of 80% to 95%, an average pore diameter of 30 $\mu$m to 250 $\mu$m, and a 30% compressive stress of 15 g/cm$^2$ to 150 g/cm$^2$ in an adequate water containing condition.

6. A cleaning rotary brush according to claim 3 or 4, wherein said ridged projections are made of a polyvinyl acetal porous elastomer having a porosity of 80% to 95%, an average pore diameter of 30 $\mu$m to 250 $\mu$m, and a 30% compressive stress of 15 g/cm$^2$ to 150 g/cm$^2$ in an adequate water containing condition.

* * * * *